(12) United States Patent
Fujishita et al.

(10) Patent No.: US 6,617,053 B2
(45) Date of Patent: Sep. 9, 2003

(54) ORGANIC ELECTROLUMINESCENT DEVICE CONTAINING DITHIAFULVENE DERIVATIVE

(75) Inventors: Yuichi Fujishita, Yokohama (JP); Manabu Uchida, Yokohama (JP); Takaharu Nakano, Yokohama (JP); Kenji Furukawa, Yokohama (JP)

(73) Assignee: Chisso Corporation, Osaka (JP)

( * ) Notice: Subject to any disclaimer, the term of this patent is extended or adjusted under 35 U.S.C. 154(b) by 0 days.

(21) Appl. No.: 09/920,850

(22) Filed: Aug. 3, 2001

(65) Prior Publication Data

US 2002/0027415 A1 Mar. 7, 2002

(30) Foreign Application Priority Data

Aug. 4, 2000 (JP) ........................................ 2000-236617

(51) Int. Cl.$^7$ ................................................. H05B 33/12
(52) U.S. Cl. ....................... 428/690; 428/917; 313/504; 313/506
(58) Field of Search ................................. 428/690, 917; 313/504, 506; 549/29, 30, 32, 49, 50

(56) References Cited

U.S. PATENT DOCUMENTS

| | | | |
|---|---|---|---|
| 4,047,948 A | 9/1977 | Horgan | |
| 4,536,457 A | 8/1985 | Tam | |
| 5,047,687 A | 9/1991 | VanSlyke | 313/503 |
| 5,876,786 A | * | 3/1999 | Zyung et al. | 427/64 |

FOREIGN PATENT DOCUMENTS

| | | |
|---|---|---|
| DE | 25 34 713 | 2/1977 |
| JP | 57-144558 | 9/1982 |
| JP | 61-062038 | 3/1986 |
| JP | 61-112164 | 5/1986 |
| JP | 61-124949 | 6/1986 |
| JP | 61-134354 | 6/1986 |
| JP | 61-134355 | 6/1986 |
| JP | 63-264692 | 11/1988 |
| JP | 04-212286 | 8/1992 |
| JP | 04-308688 | 10/1992 |
| JP | 04-363891 | 12/1992 |
| JP | 05-234681 | 9/1993 |
| JP | 05-239455 | 9/1993 |
| JP | 06-001972 | 1/1994 |
| JP | 6-32307 | 4/1994 |
| JP | 06-267658 | 9/1994 |
| JP | 06-312979 | 11/1994 |
| JP | 07-090256 | 4/1995 |
| JP | 07-097355 | 4/1995 |
| JP | 07-126226 | 5/1995 |
| JP | 07-126615 | 5/1995 |
| JP | 07-278537 | 10/1995 |
| JP | 07-331238 | 12/1995 |
| JP | 08-048656 | 2/1996 |
| JP | 08-087122 | 4/1996 |
| JP | 08-100172 | 4/1996 |
| JP | 08-259940 | 10/1996 |
| JP | 09-194441 | 7/1997 |

OTHER PUBLICATIONS

Tang, C.W., et al. "Electroluminescence of doped organic thin films", J. Appl. Phys., vol. 65, No. 9 (May 1989), pp. 3610–3616.

Adachi, C., et al. "Electroluminescence in Organic Films with Three–Layer Structure", Japanese J. Appl. Phys., vol. 27, No. 2 (Feb. 1988), pp. L269–271.

Adachi, C., et al. "Confinement of charge carriers and molecular excitons within 5–nm–thick emitter layer in organic electroluminescent devices with a double heterostructure", Appl. Phys. Lett., vol. 57, No. 6 (Aug. 1990), pp. 531–533.

Kuwabara, Y., et al. "Thermally Stable Multilayered Organic Electroluminescent Devices Using Novel Starburst Molecules, 4, 4', 4"–Tri(N–carbazolyl)triphenylamine (TCTA) and 4,4', 4"–Tris(3–methylphenylphenylamino)triphenylamine (m–MTDATA), as Hole–Transport Materials", Adv. Mater., vol. 6, No. 9 (1994), pp. 677–679. (No month).

Tanaka, H., et al. "Novel hole–transporting materials based on triphenylamine for organic electroluminescent devices", J. Chem. Soc. Chem. Commun., (1996), pp. 2175–2176 (No month).

Yamashita, Y., et al. "Novel TTF vinylogues affording stable cation radicals", Synthetic Metals, vol. 102 (1999), pp. 1730–1731. (No month).

Bryce, M.R., et al. "New Vinylogous Tetrathiafulvane π–Electron Donors with Peripheral Alkyseleno Substitution", J. Org. Chem., vol. 57 (1992), pp. 1696–1699. (No month).

$72^{nd}$ Chemical Society of Japan National Meeting, Lecture Proc. (II), p. 1392, 2PBO98. (Date not given).

(List continued on next page.)

Primary Examiner—Marie Yamnitzky
(74) Attorney, Agent, or Firm—Wenderoth, Lind & Ponack, L.L.P.

(57) ABSTRACT

An organic electroluminescent device having a high luminous efficiency and a long life, which comprises a dithiafulvene derivative represented by Formula (1):

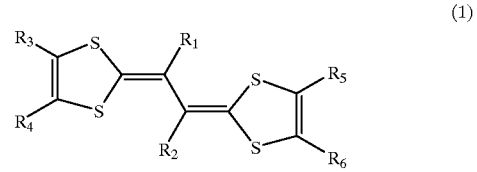

(1)

wherein $R_1$ and $R_2$ represent an alkyl group, an aryl group or a heterocyclic group; $R_3$ to $R_6$ represent a hydrogen atom, an alkyl group, an alkenyl group, an alkylthio group, an arylthio group, an aryl group or a heterocyclic group; and when $R_3$ to $R_6$ are an aryl group or a heterocyclic group adjacent to each other, they may be condensed to each other.

8 Claims, No Drawings

OTHER PUBLICATIONS

Yamaguchi, Y., et al. "Application of Unsymmetrical Diphenoquinone Derivatives to Xerography (I)—Molecular Design of a Novel Class of Polymer–dispersible Electron–Transport–active Compounds", Journal of the Society of Electrophotography of Japan, vol. 30, No. 3 (1991), pp. 266–273. (No month).

Adachi, C., et al. "Organic Electroluminescent Device with a Three–Layer Structure", Japanese J. Appl. Phys., vol. 27, No. 4 (Apr. 1988), pp. L713–L715.

Adachi, C., et al. "Organic electroluminescent device having a hole conductor as an emitting layer", Appl. Phys. Lett., vol. 55, No. 15 (Oct. 1989), pp. 1489–1491.

Kido, J., et al. "1,2,4–Triazole Derivative as an Electron Transport Layer in Organic Electroluminescent Devices", Jpn. J. Appl. Phys., vol. 32 (Jul. 1993), pp. L917–L920.

Polymer Preprints, Japan, vol. 43, No. 3 (1994), (III) Pla007, p. 978. (No month).

Izumizawa, T., et al. "Study on Electroluminescent Behaviors of Metal (III)–quinolinolates", Technical Report of Institute of Electronics, Information and Communication Engineers, vol. 92, No. 11 (1992), p. 43–48. (No month).

Yamamoto, T., et al. "Polymer Light–Emitting Diodes with Single– and Double–Layer Structures Using Poly(2, 3–diphenylquinoxaline–5,8–diyl)", Jpn. J. Appl. Phys., vol. 33 (Feb. 1994), pp. L250–253.

Polymer Preprints, Japan, vol. 43, No. 7 (1994), 14J07, pp. 2450–2451. (No month).

Society of Polymer Science, ed., Functional Polymer Material Series, "Optical Function Materials", (1991) pp. 232–241. (No month).

$40^{th}$ Japan Applied Physics Related Association Meeting, Lecture Proc., (1993), p. 1146. (No month).

$9^{th}$ Japan Society of Applied Physics Workshop, Proc., (2001), pp. 17–22. (No month).

"Organic EL Material and Display", CMC, (2001), pp. 169–173. (No month).

* cited by examiner

ORGANIC ELECTROLUMINESCENT DEVICE CONTAINING DITHIAFULVENE DERIVATIVE

FIELD OF THE INVENTION

The present invention relates to an organic electroluminescent device (hereinafter abbreviated as an organic EL device). More specifically, it relates to an organic electroluminescent device containing a dithiafulvene derivative.

BACKGROUND OF THE INVENTION

In recent years, an organic EL device has been the focus of interest as a next-generation full color flat panel display, and actively researched and developed. The organic EL device is an injection type luminescent device wherein a luminescent layer is sandwiched between two electrodes, and the device emits light by injecting an electron and a hole into an organic luminescent layer and recombining them. The materials used include a low molecular material and a high molecular material, and it is known that both provide organic EL devices having a high luminance.

Such organic EL devices include two types. One is a device in which an electron-transporting material containing a fluorescent dye is used as a luminescent layer, reported by C. W. Tang, et al. (J. Appl. Phys., 65, 3610 (1989)), and the other is a device in which a fluorescent dye itself is used as a luminescent layer (e.g., a device described in Jpn. J. Appl. Phys., 27, L269 (1988)).

The device using a fluorescent dye as a luminescent layer is further divided roughly into three types. The first one is a device having a three-layer structure in which a luminescent layer is sandwiched between an electron-transporting layer and a hole-transporting layer. The second one is a device having a two-layer structure in which a hole-transporting layer and a luminescent layer are laminated. The third one is a device having a two-layer structure in which an electron-transporting layer and a luminescent layer are laminated. It is known that an organic EL device is improved in luminous efficiency by employing such multilayer structures.

An electron-transporting layer in the organic EL devices of the respective structures described above contains an electron-transferring compound and has a function to transfer an electron injected from a cathode to a luminescent layer. A hole-transporting layer and a hole-injecting layer are layers containing hole-transferring compounds and carry out a function to transfer a hole injected from an anode to a luminescent layer. The intervention of a hole-injecting layer between an anode and a luminescent layer makes it possible to transfer many holes from the anode to the luminescent layer by a lower electric field and to confine electrons injected from an electron-transporting layer or an electron-injecting layer in the luminescent layer. Thus, an organic EL device having an excellent luminescent performance such as an improved luminous efficiency can be obtained.

However, these organic EL devices do not show a sufficiently high performance for practical use. This is mainly due to poor durability of the materials used, and particularly poor durability of a hole-transporting material. It is considered that if a heterogeneous part such as a grain boundary is present in an organic layer of an organic EL device, an electric field is concentrated into the part, which results in deteriorating and breaking the device. Accordingly, the organic layer is used in an amorphous state in many cases. An organic EL device is an electron-injecting type device, which requires a material having a high glass transition temperature (hereinafter abbreviated as Tg), because use of a material having a low glass transition point results in deteriorating the organic EL device due to heat generated during driving. Further, the hole-transporting materials used do not have a satisfactory hole-transporting property, and the device does not have a sufficiently high luminous efficiency for practical use.

A wide variety of materials including amino compounds are known as hole-transporting materials used for such organic EL devices, but only a few materials are suitable for practical use. For example, N,N'-diphenyl-N,N'-di(3-methylphenyl)-4,4'-diaminobiphenyl (hereinafter abbreviated as TPD) has been reported (Appl. Phys. Lett., 57, 6, 531 (1990)), but this compound has a poor heat stability and also has problems with the life of the device, etc. Many triphenylamine derivatives have been described in U.S. Pat. Nos. 5,047,687, 4,047,948, 4,536,457, JP-B 6-32307, JP-A 5-234681, JP-A 5-239455, JP-A 8-87122 and JP-A 8-259940, but they do not have satisfactory characteristics.

Star-burst amine derivatives described in JP-A 4-308688, JP-A 6-1972 and Adv. Mater., 6, 677 (1994), and compounds described in JP-A 7-126226, JP-A 7-126615, JP-A 7-331238, JP-A 7-97355, JP-A 8-48656, JP-A 8-100172 and J. Chem. Soc. Chem. Comm., 2175, (1996) do not have both a high luminous efficiency and a long life which are the essential characteristics for practical use. Further, JP-A 9-194441 has reported examples wherein naphthylamine derivatives are used, and described that the properties thereof are more improved than those of TPD. These compounds, however, do not have any satisfactory hole-transporting property or durability.

As described above, conventional amine-based hole-transporting materials used for organic EL devices do not meet high performance requirements of recent full color flat panel displays, and excellent materials have been desired to provide an organic EL device having a higher efficiency and a longer life.

SUMMARY OF THE INVENTION

The present invention has been achieved in light of the problems of such conventional techniques as described above. An object thereof is to provide a material comprising a hole-transferring compound other than amino compounds conventionally used, and an organic EL device having a high luminous efficiency and a long life which contains the above compound.

The present inventors have made intensive investigations in order to solve the preceding problems involved in conventional organic EL devices and, as a result, found that specific dithiafulvene derivatives are high-performance hole-injecting and hole-transporting materials and that use of this derivative provides an organic EL device having a high luminous efficiency and a long life. Thus, they have completed the present invention.

The present invention is described as follows.

(1) An organic electroluminescent device comprising a dithiafulvene derivative represented by Formula (1):

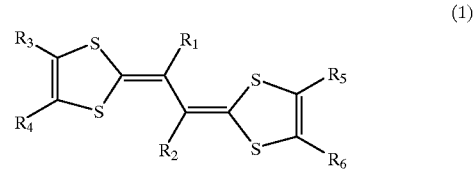

(1)

wherein $R_1$ and $R_2$ each independently represent an alkyl group having 1 to 6 carbon atoms, a substituted or unsubstituted aryl group or a substituted or unsubstituted heterocyclic group; $R_3$ to $R_6$ each independently represent a hydrogen atom, an alkyl group having 1 to 6 carbon atoms, an alkenyl group having 2 to 6 carbon atoms, an alkylthio group having 1 to 6 carbon atoms, a substituted or unsubstituted arylthio group, a substituted or unsubstituted aryl group or a substituted or unsubstituted heterocyclic group; when $R_3$ to $R_6$ are an aryl group or a heterocyclic group adjacent to each other, they may be condensed to each other; and when $R_3$ to $R_6$ are an alkenyl group or an alkylthio group adjacent to each other, they may be bonded to each other.

(2) The organic electroluminescent device as described in the above item (1), wherein the dithiafulvene derivative represented by Formula (1) is contained in a hole-injecting layer.

(3) The organic electroluminescent device as described in the above item (1), wherein the dithiafulvene derivative represented by Formula (1) is contained in a hole-transporting layer.

(4) A hole-injecting material comprising the dithiafulvene derivative represented by Formula (1).

(5) A hole-transporting material comprising the dithiafulvene derivative represented by Formula (1).

DETAILED DESCRIPTION OF THE INVENTION

The present invention shall be explained below in details.

When $R_1$, $R_2$, $R_3$, $R_4$, $R_5$ or $R_6$ is an alkyl group in Formula (1), it preferably has 1 to 6 carbon atoms. Examples thereof include methyl, ethyl, n-propyl, isopropyl, n-butyl, sec-butyl, tert-butyl, n-pentyl, n-hexyl, cyclopropyl, cyclobutyl, cyclopentyl and cyclohexyl. Examples wherein $R_1$, $R_2$, $R_3$, $R_4$, $R_5$ or $R_6$ is an aryl group include phenyl, naphthyl, anthryl, pyrenyl, phenanthryl, fluorenyl, tolyl, xylyl, 4-(N,N-diphenylamino)phenyl, 4-(N,N-diphenylamino)naphthyl, 4-(N-phenothiazinyl)phenyl and 4-(N-carbazolyl)phenyl. Examples of the heterocyclic group include thienyl, benzothienyl, thianthrenyl, 3-phenylbenzothienyl, N-phenylphenothiazinyl and N-phenylcarbazolyl. When $R_3$, $R_4$, $R_5$ or $R_6$ is an alkenyl group, it preferably has 2 to 6 carbon atoms. Examples thereof include vinyl, allyl, 1-propenyl, 1,3-butadienyl, 2-pentenyl and 2-hexenyl. When $R_3$, $R_4$, $R_5$ or $R_6$ is an alkylthio group, it has preferably 1 to 6 carbon atoms. Examples thereof include methylthio, ethylthio and propylthio. Examples of the arylthio group include phenylthio and naphthylthio. Specific examples of the dithiafulvene derivative are compounds represented by the following Formulas (2) to (11):

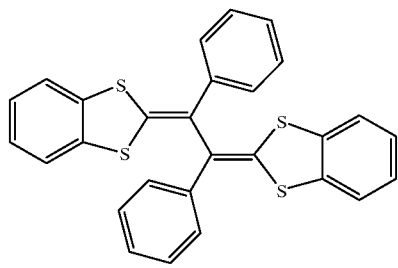

(2)

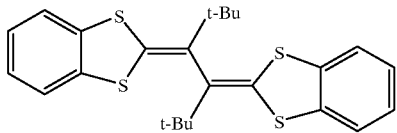

(3)

In Formula, t-Bu represents t-butyl.

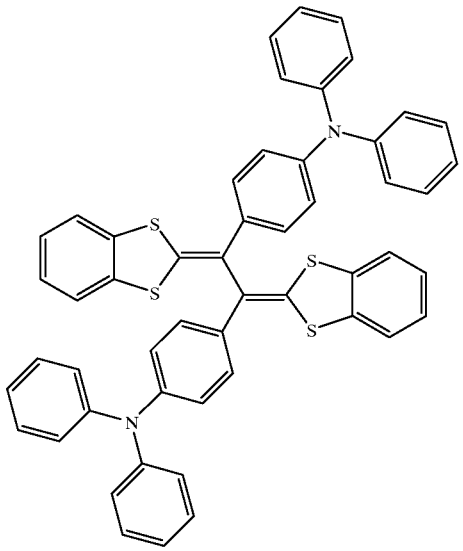

(4)

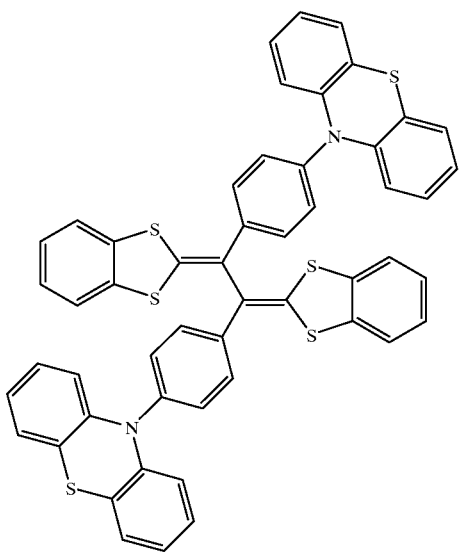

(5)

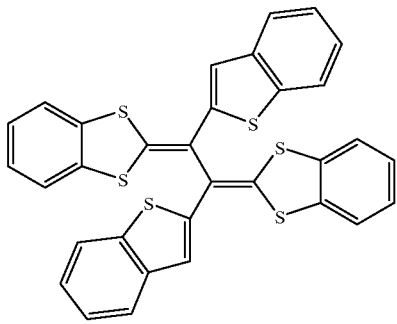

(6)

-continued

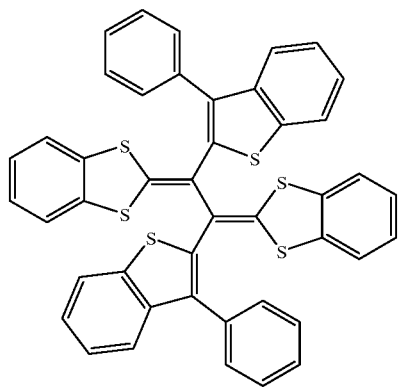

(7)

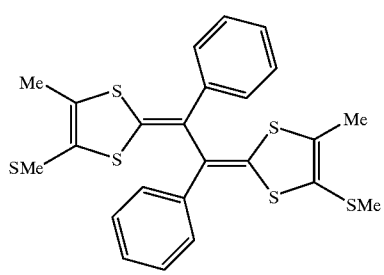

(8)

In Formula, Me represents methyl.

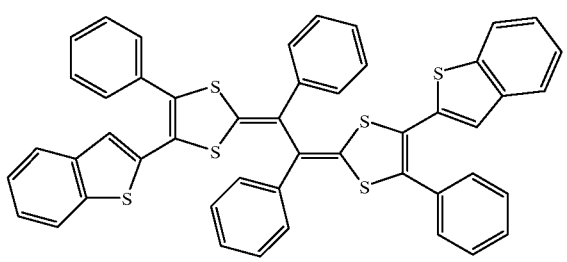

(9)

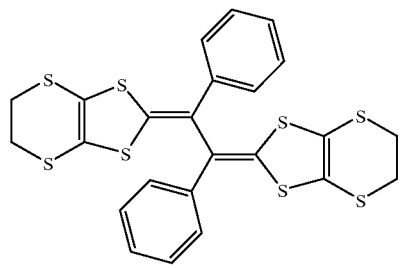

(10)

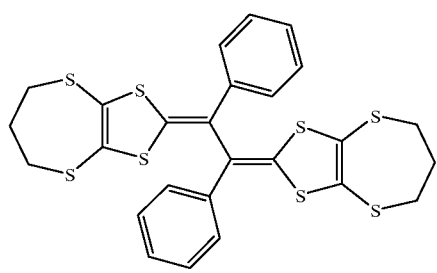

(11)

These compounds can be synthesized making use of known methods. They can be obtained, for example, by methods described in Synth. Met., 102, 1730 (1999) and J. Org. Chem., 57, 1696 (1992) or methods described in synthetic examples of the present specification.

These dithiafulvene derivatives are suited to materials for forming a hole-injecting layer and a hole-transporting layer. The organic EL device of the present invention has not only a high efficiency but also a high durability in storing and driving. This is because the dithiafulvene derivative represented by Formula (1) used in the present invention has a high Tg and is liable to turn into an amorphous state in preparing the organic EL device.

The organic EL device of the present invention may have a structure of various types and basically a structure in which an organic layer containing the above dithiafulvene derivative is sandwiched between a pair of electrodes (anode and cathode). If necessary, a hole-injecting layer, a hole-transporting layer, a luminescent layer, an electron-injecting layer or an electron-transporting layer each using the other materials may be combined in addition to the dithiafulvene derivative layer described above. When the dithiafulvene derivative is used as a hole-injecting material or a hole-transporting material, the other materials can be used in combination therewith in order to further improve the performance.

The specific structure includes (1) anode/dithiafulvene derivative layer (hole-injecting layer)/hole-transporting layer/luminescent layer/cathode, (2) anode/dithiafulvene derivative layer (hole-injecting layer)/hole-transporting layer/luminescent layer/electron-injecting layer/cathode, (3) anode/dithiafulvene derivative layer (hole-transporting layer)/luminescent layer/cathode and (4) anode/hole-injecting layer/dithiafulvene derivative layer (hole-transporting layer)/luminescent layer/electron-injecting layer/cathode. In these cases, an electron-injecting layer, and a hole-injecting layer when the dithiafulvene derivative is used for a hole-transporting layer, are not necessarily required, but these layers can improve the luminous efficiency. The dithiafulvene derivative used for a hole-injecting layer can provide the organic EL device particularly having a high efficiency and a long life.

The organic EL device having any structure described above according to the present invention is preferably supported on a substrate. Any substrate may be used as long as it has a mechanical strength, a heat stability and a transparency. For example, glass and a transparent plastic film can be used therefor. Metal, alloy, electroconductive compounds and a mixture thereof each having a larger work function than 4 eV can be used as an anodic material for the organic EL device of the present invention. Specific examples thereof include metal such as Au and conductive transparent materials such as CuI, indium tin oxide (hereinafter abbreviated as ITO), $SnO_2$ and ZnO.

Metal, alloy, electroconductive compounds and a mixture thereof each having a smaller work function than 4 eV can be used as the cathodic material. Specific examples thereof include aluminum, calcium, magnesium, lithium, magnesium alloy and aluminum alloy. The alloy includes aluminum/lithium fluoride, aluminum/lithium, magnesium/silver and magnesium/indium. In order to efficiently obtain luminescence of the organic EL device, at least one of the electrodes preferably has a light transmittance controlled to 10% or more. A sheet resistance of the electrode is controlled preferably to several hundred Ω/□ or less. The film thickness is selected in the range of usually 10 nm to 1 μm, preferably 10 to 400 nm, depending on a property of the electrode material. Such electrodes can be prepared by forming a thin film by a method such as vapor deposition and sputtering using the electrode substances described above.

The dithiafulvene derivative represented by Formula (1) used in the organic EL device of the present invention has a sufficiently high Tg, and the other hole-injecting materials, hole-transporting materials, luminescent materials and electron-injecting materials preferably have a Tg of 80° C. or higher, more preferably 90° C. or higher.

The hole-injecting materials and hole-transporting materials used for the organic EL device of the present invention may optionally be photoconductive materials selected from compounds conventionally used as an electron-transporting material for a hole and publicly known compounds used for a hole-injecting layer and a hole-transporting layer of an organic EL device. They include, for example, carbazole derivatives (N-phenylcarbazole, polyalkylenecarbazole, etc.), triarylamine derivatives (TPD, polymers having aromatic tertiary amine on a principal chain or a side chain), 1,1-bis(4-di-p-tolylaminophenyl)-cyclohexane, N,N'-diphenyl-N,N'-dinaphthyl-4,4'-diaminobiphenyl, 4,4',4''-tris{N-(3-methylphenyl)-N-phenylamino}triphenylamine, compounds described in J. Chem. Soc. Chem. Comm., 2175 (1996), compounds described in JP-A 57-144558, JP-A 61-62038, JP-A 61-124949, JP-A 61-134354, JP-A 61-134355, JP-A 61-112164, JP-A 4-308688, JP-A 6-312979, JP-A 6-267658, JP-A 7-90256, JP-A 7-97355, JP-A 6-1972, JP-A 7-126226, JP-A 7-126615, JP-A 7-331238, JP-A 8-100172 and JP-A 8-48656, and star-burst amine derivatives described in Adv. Mater., 6, 677 (1994), stilbene derivatives described in 72nd CSJ (the Chemical Society of Japan) National Meeting, Lecture Proc. (II), p. 1392, 2PB098, phthalocyanine derivatives (non-metallic, copper phthalocyanine, etc.), and polysilanes.

The hole-injecting layer and the hole-transporting layer in the organic EL device of the present invention may comprise a single layer containing the dithiafulvene derivative of the present invention and/or at least one compound described above, or laminated plural layers containing different kinds of the compounds. These layers can also be formed by dispersing the dithiafulvene derivative of the present invention in a high polymer.

The other electron-injecting materials and electron-transporting materials used for the organic EL device of the present invention shall not specifically be restricted. They may optionally be photoconductive materials selected from compounds conventionally used as an electron-transferring compound and publicly known compounds used for an electron-injecting layer and an electron-transporting layer of an organic EL device. Preferred examples of such an electron-transferring compound include diphenylquinone derivatives (those described in Journal of the Society of Electrophotography of Japan, 30 (3), 266 (1991), etc.), perylene derivatives (those described in J. Apply. Phys., 27, 269 (1988), etc.), oxadiazole derivatives (those described in the above literatures, Jpn. J. Apply. Phys., 27, L713 (1988), Appl. Phys. Lett., 55, 1489 (1989), etc.), thiophene derivatives (those described in JP-A 4-212286), triazole derivatives (those described in Jpn. J. Appl. Phys., 32, L917 (1993), etc.), thiadiazole derivatives (those described in Polymer Preprints, Japan, Vol. 43, No. 3 (1994), (III) Pla007, etc.), metal complexes of oxine derivatives (those described in Technical Report of Institute of Electronics, Information and Communication Engineers, 92 (311), 43 (1992), etc.), polymers of quinoxaline derivatives (those described in Jpn. J. Appl. Phys., 33, L250 (1994), etc.), and phenanthroline derivatives (those described in Polymer Preprints, Japan, Vol. 43, No. 7 (1994), 14J07, etc.)

The other luminescent materials used for a luminescent layer in the organic EL device of the present invention may be publicly known luminescent materials such as daylight fluorescent materials, fluorescent whitening agents, laser pigments, organic scintillators and various fluorescent analytical reagents which are described in Functional Polymer Material Series, "optical Function Materials", p. 236 (1991), edited by Society of Polymer Science, Japan, Kyoritsu Shuppan Co., Ltd. Specifically, preferred are polycyclic condensation compounds such as anthracene, phenanthrene, pyrene, chrysene, perylene, coronene, rubrene and quinacridone; oligophenylene compounds such as quarter phenyl; scintillators for liquid scintillation such as 1,4-bis(2-methylstyryl)benzene, 1,4-bis(4-methylstyryl)benzene, 1,4-bis(4-phenyl-5-oxazolyl)benzene, 1,4-bis(5-phenyl-2-oxazolyl)benzene, 2,5-bis(5-tertiary-butyl-2-benzoxazolyl) thiophene, 1,4-diphenyl-1,3-butadiene, 1,6-diphenyl-1,3,5-hexatriene and 1,1,4,4-tetraphenyl-1,3-butadiene; metal complexes of oxine derivatives described in JP-A 63-264692; coumarin dyes, dicyanomethylenepyran dyes, dicyanomethylenethiopyran dyes, polymethine dyes, oxobenzanthracene dyes, xanthene dyes, carbostyryl dyes and perylene dyes; oxazine compounds described in German Patent 2534713; stilbene derivatives described in the 40th Japan Applied Physics Related Association Meeting, Lecture Proc., 1146 (1993); spiro compounds described in JP-A 7-278537; and oxadiazole compounds described in JP-A 4-363891. Also preferred as the luminescent material are publicly known phosphorescent materials described in the 9th JSAP (Japan Society of Applied Physics) Workshop, Proc., p. 17 (2001) and "Organic EL Material and Display", CMC, p. 170 (2001), for example, iridium complexes, platinum complexes and europium complexes.

The respective layers constituting the organic EL device of the present invention can be prepared by forming thin films from materials for the respective layers by a conventionally known method such as a deposition method, a spin coating method and a casting method. The film thickness of the respective layers thus formed shall not specifically be restricted and can suitably be selected according to the properties of the materials. It is usually selected in the range of 2 to 5000 nm. A deposition method is preferably employed as a method for forming a thin film from the dithiafulvene derivative alone because it can provide a homogeneous film and hardly produces pin holes. When the deposition method is used to form the thin film, the depositing conditions may be varied depending on the kind of the dithiafulvene derivatives, the intended crystalline structure and associated structure of a molecular built-up film. In general, it is preferable that they are suitably selected in the ranges of a boat-heating temperature of 50 to 400° C., a vacuum degree of $10^{-6}$ to $10^{-3}$ Pa, a deposition rate of 0.01 to 50 nm/second, a substrate temperature of −150 to +300° C. and a film thickness of 5 nm to 5 μm.

Next, a production process for the organic EL device comprising the anode/dithiafulvene derivative/luminescent layer/cathode described above shall be explained as one example of a process for producing the organic EL devices using the dithiafulvene derivative of the present invention. A thin film comprising a material for an anode is formed on a suitable substrate by a deposition method so that the film thickness should be in the range of 1 μm or less, preferably 10 to 200 nm to thereby form an anode, and then a thin film of the dithiafulvene derivative is formed on this anode to prepare a hole-transporting layer. A luminescent layer is formed on this hole-transporting layer so that the film thickness should be 1 μm or less. Further, a thin film comprising a material for a cathode is formed thereon by the deposition method so that the film thickness should be 1 μm or less to form a cathode, whereby the intended organic EL device is obtained. In the production of the organic EL device described above, the production order can be inverted, so that the cathode, the luminescent layer, the hole-transporting layer and the anode may be produced in this order.

When applying a DC voltage to the organic EL device thus obtained, it may be applied with the anode set to a positive polarity and the cathode set to a negative polarity. If applying a voltage of approximately 2 to 40 V, luminescence can be observed from the transparent or translucent electrode side (anode or cathode, and both). This organic EL device emits light as well when applying an AC voltage. Any waveform of the AC may be applied.

The present invention shall be explained in further details with reference to examples.

SYNTHETIC EXAMPLES 2,2'-(1,2-Diphenylethanediylidene)bis[1,3]benzo[d]dithiol (hereinafter abbreviated as DPBDT) (synthesis of a compound represented by Formula (2))

SYNTHETIC EXAMPLE 1

(1) Synthesis of 2-benzylidene-[1,3]benzo[d]dithiol

A flask was charged with 2.9 g of 2-(ethoxy-phosphoryl)[1,3]benzo[d]dithiol and 50 ml of tetrahydrofuran and cooled down to $-78°$ C. under an argon atmosphere, and then 7.5 ml of an n-butyl lithium/n-hexane solution having a concentration of 1.5 mol/l was dropwise added thereto. After stirring for about 30 minutes, 1.0 ml of benzaldehyde was dropwise added, and the solution was stirred overnight at room temperature. After finishing the reaction, purified water was added to extract the organic layer. It was concentrated by means of an evaporator to obtain 2.4 g of the desired compound.

$^1$H-NMR (CDCl$_3$) σ=7.3–7.6 (m, 5H), 7.1–7.3 (m, 2H), 7.1 (m, 2H), 6.5 (s, 1H)

(2) Synthesis of DPBDT

A 200-ml three-neck flask was charged with 1.9 g of 2-benzylidene-[1,3]benzo[d]dithiol, 4.9 g of tris(4-bromophenyl)aminium hexachloroantimonate and 70 ml of dichloromethane, and the solution was stirred overnight at room temperature under an argon atmosphere. A 100-ml three-neck flask was charged with 3.1 g of a solid matter obtained by filtering the reaction solution, 176 mg of zinc and 50 ml of acetonitrile, and the solution was refluxed for 3 hours under an argon atmosphere. The reaction solution was filtered, and the resulting solution was concentrated by means of an evaporator. The resulting concentrate was refined by means of a column chromatography to obtain 300 mg of the desired compound. The Tg was 96° C.

$^1$H-NMR (CDCl$_3$) σ=7.5–7.6 (d, 4H), 7.3–7.4 (t, 4H), 7.2–7.3 (m, 6H), 7.1 (t, 4H)

SYNTHETIC EXAMPLE 2
Synthesis of DPBDT

A flask was charged with 3.49 g of 2-(ethoxy-phosphoryl)[1,3]benzo[d]dithiol and 80 ml of tetrahydrofuran and cooled down to −78° C under an argon atmosphere, and then 9 ml of an n-butyl lithium/n-hexane solution having a concentration of 1.5 mol/l was dropwise added thereto. After warming up to −20° C., a solution of 0.84 g of benzyl dissolved in 10 ml of tetrahydrofuran was dropwise added thereto, and the solution was stirred overnight at a refluxing temperature. After finishing the reaction, the solution was cooled down to room temperature, and purified water was added to extract the organic layer. It was concentrated by means of an evaporator, and the resulting concentrate was refined by means of a column chromatography to obtain 1 g of the desired compound.

SYNTHETIC EXAMPLE 3

Synthesis of 2,2'-(1,2-bis(4-N,N-diphenylaminophenyl)-ethanediylidene)bis[1,3]benzo[d]dithiol (hereinafter abbreviated as BPABDT) (synthesis of a compound represented by Formula (4))

The compound was synthesized by the same method as in Synthetic Example 1, except that 4-(N,N-diphenylamino)benzaldehyde was substituted for benzaldehyde. The Tg was 144° C.

Each compound represented by Formulas (3), (5), (6) and (7) may be synthesized by the same method as in Synthetic Example 1, except using tert-butylaldehyde, 4-(N-phenothiazinyl)phenylaldehyde, 2-benzothienylaldehyde and 2-(3-phenyl)benzothienylaldehyde, respectively in place of benzaldehyde. Each compound represented by Formulas (3), (4), (5), (6) and (7) may also be synthesized by the same method as in Synthetic Example 2, except using di-tert-butyldiketone, bis-4-(N,N-diphenylamino)phenyldiketone, bis-4-(N-phenothiazinyl)phenyldiketone, di-2-benzothienyl-diketone and bis-2-(3-phenyl)benzothienyldiketone, respectively in place of benzyl. Further, each compound represented by Formulas (8), (9), (10) and (11) may be synthesized by the same method as in Synthetic Examples 1 and 2, except using 2-(ethoxyphosphoryl)-4-methyl-5-(methylthio)-1,3-dithiol, 2-(ethoxyphosphoryl)-4-phenyl-5-(benzothienyl)-1,3-dithiol, 2-(ethoxyphosphoryl)-5,6-dihydro-1,3-dithiolo[4,5-b][1,4]dithiin and 2-(ethoxy-phosphoryl)-5,6,7-trihydro-1,3-dithiolo[4,5-b][1,4]dithiin, respectively in place of 2-(ethoxyphosphoryl)-[1,3]benzo[d]dithiol.

EXAMPLE 1

ITO was deposited in a thickness of 50 nm on a glass substrate of 25 mm×75 mm×1.1 mm by a deposition method, which was used as a transparent supporting substrate (manufactured by Tokyo Sanyo Vacuum Co., Ltd.). This transparent supporting substrate was fixed on a substrate holder of a commercially available depositing apparatus (manufactured by Sinku Kiko Co., Ltd.), which was equipped with a molybdenum boat containing DPBDT, a molybdenum boat containing N,N'-dinaphthyl-N,N'-diphenyl-4,4'-diaminobiphenyl (hereinafter abbreviated as NPD), a molybdenum boat containing tris(8-hydroxyquinoline)aluminum (hereinafter abbreviated as ALQ), a molybdenum boat containing lithium fluoride and a tungsten boat containing aluminum. The pressure was reduced to $1\times10^{-3}$ Pa in the vacuum chamber, and the molybdenum boat containing DPBDT was heated to deposit DPBDT so that the film thickness should be 40 nm, thus forming a hole-injecting layer. The boat containing NPD was heated to deposit NPD so that the film thickness should be 10 nm, thus forming a hole-transporting layer. The boat containing ALQ was then heated to deposit ALQ so that the film thickness should be 50 nm, thus forming a luminescent layer. The deposition speeds for each layer were 0.1 to 0.2 nm/second. Then, the boat containing lithium fluoride was heated to deposit lithium fluoride at a deposition speed of 0.003 to 0.01 nm/second so that the film thickness should be 0.5 nm, and subsequently the boat containing aluminum was heated to deposit aluminum at a deposition speed of 0.2 to 0.5 nm/second so that the film thickness should be 100 nm, whereby an organic EL device was obtained. A DC voltage of about 4 V was applied with an ITO electrode used as an anode and a lithium fluoride/aluminum electrode used as a cathode. A current of about 3 mA/cm$^2$ flowed and a green light having a luminance of about 100 cd/m$^2$, a luminous efficiency of about 3 lm/W and a wavelength of 520 nm was emitted. Driving at a constant current of 50 mA/cm$^2$ was carried out and the light was continuously emitted even after 100 hours. Further, reduction in the luminescence was not observed even when heated at 80° C.

EXAMPLE 2

An organic EL device was obtained by the same method as in Example 1, except that BPABDT was substituted for DPBDT. A DC voltage of about 3 V was applied with an ITO electrode used as an anode and a lithium fluoride/aluminum electrode used as a cathode. A current of about 3 mA/cm$^2$ flowed and a green light having a luminance of about 100 cd/m$^2$, a luminous efficiency of about 3 lm/W and a wavelength of 520 nm was emitted. Driving at a constant current of 50 mA/cm$^2$ was carried out and the light was continuously emitted even after 100 hours. Further, reduction in the luminescence was not observed even when heated at 80° C.

EXAMPLE 3

In the same manner as in Example 1, a transparent supporting substrate was fixed on a substrate holder of the depositing apparatus, which was equipped with a molybdenum boat containing DPBDT, a molybdenum boat containing ALQ, a molybdenum boat containing lithium fluoride and a tungsten boat containing aluminum. The pressure was reduced to 1×10$^{-3}$ Pa in the vacuum chamber, and the molybdenum boat containing DPBDT was heated to deposit DPBDT so that the film thickness should be 50 nm, thus forming a hole-transporting layer. The boat containing ALQ was heated to deposit ALQ so that the film thickness should be 50 nm, thus forming a luminescent layer. The deposition speeds were 0.1 to 0.2 nm/second. Then, the boat containing lithium fluoride was heated to deposit lithium fluoride at a deposition speed of 0.003 to 0.01 nm/second so that the film thickness should be 0.5 nm, and subsequently the boat containing aluminum was heated to deposit aluminum at a deposition speed of 0.2 to 0.5 nm/second so that the film thickness should be 100 nm, whereby an organic EL device was obtained. A DC voltage of about 5 V was applied with an ITO electrode used as an anode and a lithium fluoride/ aluminum electrode used as a cathode. A green light having a luminance of about 100 cd/m$^2$ and a wavelength of 520 nm was emitted. Driving at a constant current of 50 mA/cm$^2$ was carried out and reduction in the luminescence was not observed even when heated at 80° C.

EXAMPLE 4

In the same manner as in Example 1, a transparent supporting substrate was fixed on a substrate holder of the depositing apparatus, which was equipped with a molybdenum boat containing 4,4',4"-tris{N-(3-methylphenyl)-N-phenylamino}triphenylamine, a molybdenum boat containing DPBDT, a molybdenum boat containing ALQ, a molybdenum boat containing lithium fluoride and a tungsten boat containing aluminum. The pressure was reduced to 1×10$^{-3}$ Pa in the vacuum chamber, and the molybdenum boat containing 4,4',4"-tris{N-(3-methylphenyl)-N-phenylamino}triphenylamine was heated to deposit 4,4',4"-tris{N-(3-methylphenyl)-N-phenylamino}triphenylamine so that the film thickness should be 40 nm, thus forming a hole-injecting layer was formed. The molybdenum boat containing DPBDT was heated to deposit DPBDT so that the film thickness should be 10 nm, thus forming a hole-transporting layer. Next, the boat containing ALQ was heated to deposit ALQ so that the film thickness should be 50 nm, thus forming a luminescent layer. The deposition speeds for each layer were 0.1 to 0.2 nm/second. Then, the boat containing lithium fluoride was heated to deposit lithium fluoride at a deposition speed of 0.003 to 0.01 nm/second so that the film thickness should be 0.5 nm, and subsequently the boat containing aluminum was heated to deposit aluminum at a deposition speed of 0.2 to 0.5 nm/second so that the film thickness should be 100 nm, whereby an organic EL device was obtained. A DC voltage of about 4 V was applied with an ITO electrode used as an anode and a lithium fluoride/aluminum electrode used as a cathode. A green light having a luminance of about 100 cd/m$^2$ and a wavelength of 520 nm was emitted.

Comparative Example 1

An organic EL device was prepared by the same method as in Example 3, except that TPD was substituted for DPBDT. A DC voltage was applied at 80° C. with an ITO electrode used as an anode and a lithium fluoride/aluminum electrode used as a cathode. Luminescence could not be observed after a few seconds.

Industrial Applicability

As explained above, the dithiafulvene derivative of the present invention has a high Tg of 90° C. or higher and is liable to be in an amorphous state, so that this is suitable as a hole-injecting material and a hole-transporting material for an organic EL device. In particular, the dithiafulvene derivative used as a hole-injecting material can provide the organic EL device having a higher efficiency and a longer life. That is, the organic EL device of the present invention can have a higher efficiency and a longer life and achieve full color image by using the dithiafulvene derivative for an organic layer. Accordingly, use of the organic EL device of the present invention makes it possible to prepare a display apparatus having a high efficiency such as a full color display.

What is claimed is:

1. An organic electroluminescent device comprising a hole-transporting layer and a luminescent layer, optionally in combination with a layer selected from the group consisting of a hole-injecting layer, an electron-injecting layer and an electron-transporting layer, sandwiched between an anode and a cathode, in which a dithiaflilvene derivative represented by the following Formula (1) is contained at least in one of said hole-injecting layer and said hole-transporting layer:

(1)

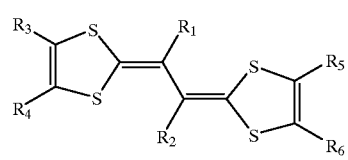

wherein $R_1$ and $R_2$ each independently represent an alkyl group having 1 to 6 carbon atoms, a substituted or unsubstituted aryl group or a substituted or unsubstituted heterocyclic group; $R_3$ to $R_6$ each independently represent a hydrogen atom, an alkyl group having 1 to 6 carbon atoms, an alkenyl group having 2 to 6 carbon atoms, an alkylthio group having 1 to 6 carbon atoms, a substituted or unsubstituted arylthio group, a substituted or unsubstituted aryl group or a substituted or unsubstituted heterocyclic group; when $R_3$ to $R_6$ are an aryl group or a heterocyclic group and are adjacent to each other, they may have a structure in which they are condensed to each other; and when $R_3$ to $R_6$ are an alkenyl group or an alkylthio group and are adjacent to each other, they may be bonded to each other.

2. The organic electroluminescent device as claimed in claim 1, wherein the dithiafulvene derivative is contained in the hole-injecting layer.

3. The organic electroluminescent device as claimed in claim 1, wherein the dithiafulvene derivative is contained in the hole-transporting layer.

4. The organic electroluminescent device as claimed in claim 1, wherein the dithiafulvene derivative has a glass transition temperature of 90° C. or higher.

5. The organic electroluminescent device as claimed in claim 1, having a structure arranged in the order of anode/layer of the dithiafulvene derivative as hole-injecting layer/hole-transporting layer/luminescent layer/cathode.

6. The organic electroluminescent device as claimed in claim 1, having a structure arranged in the order of anode/layer of the dithiafulvene derivative as hole-injecting layer/hole-transporting layer/luminescent layer/electron-injecting layer/cathode.

7. The organic electroluminescent device as claimed in claim 1, having a structure arranged in the order of anode/layer of the dithiafulvene derivative as hole-transporting layer/luminescent layer/cathode.

8. The organic electroluminescent device as claimed in claim 1, having a structure arranged in the order of anode/hole-injecting layer/layer of the dithiafulvene derivative as hole-transporting layer/luminescent layer/electron-injecting layer/cathode.

* * * * *

UNITED STATES PATENT AND TRADEMARK OFFICE
CERTIFICATE OF CORRECTION

PATENT NO. : 6,617,053 B2
DATED : September 9, 2003
INVENTOR(S) : Yuichi Fujishita et al.

It is certified that error appears in the above-identified patent and that said Letters Patent is hereby corrected as shown below:

<u>Title page,</u>
Item [*] Notice, should read -- the term of this patent is extended or adjusted under 35 U.S.C. 154(b) by 34 days. --

Signed and Sealed this

Twenty-seventh Day of April, 2004

JON W. DUDAS
*Acting Director of the United States Patent and Trademark Office*